(12) United States Patent
Moe et al.

(10) Patent No.: US 12,170,522 B2
(45) Date of Patent: Dec. 17, 2024

(54) TIME-TO-DIGITAL CONVERTER STOP TIME CONTROL

(71) Applicant: TEXAS INSTRUMENTS INCORPORATED, Dallas, TX (US)

(72) Inventors: Marius Moe, Oslo (NO); Tarjei Aaberge, Oslo (NO)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/175,683

(22) Filed: Feb. 28, 2023

(65) Prior Publication Data
US 2023/0208425 A1      Jun. 29, 2023

Related U.S. Application Data

(63) Continuation of application No. 17/515,598, filed on Nov. 1, 2021, now Pat. No. 11,595,046, which is a continuation of application No. 17/087,978, filed on Nov. 3, 2020, now Pat. No. 11,196,426, which is a continuation of application No. 16/232,911, filed on Dec. 26, 2018, now Pat. No. 10,862,488.

(51) Int. Cl.
| | |
|---|---|
| H03L 7/085 | (2006.01) |
| H03K 3/03 | (2006.01) |
| H03K 5/14 | (2014.01) |
| H03L 7/081 | (2006.01) |
| G04F 10/00 | (2006.01) |
| H03K 5/00 | (2006.01) |

(52) U.S. Cl.
CPC ........... *H03L 7/085* (2013.01); *H03K 3/0315* (2013.01); *H03K 5/14* (2013.01); *H03L 7/0812* (2013.01); *G04F 10/005* (2013.01); *H03K 2005/00019* (2013.01)

(58) Field of Classification Search
CPC ........ H03L 7/085; H03L 7/0812; H03K 5/14; H03K 3/0315; H03K 2005/00019; G04F 10/005

See application file for complete search history.

(56) References Cited

U.S. PATENT DOCUMENTS

| | | |
|---|---|---|
| 8,054,117 B2 | 11/2011 | Kim |
| 10,263,625 B1 | 4/2019 | Tokairin |
| 10,862,488 B2 | 12/2020 | Moe |
| 11,405,027 B1 * | 8/2022 | Bonomi .................. H03K 5/14 |
| 2017/0373709 A1 | 12/2017 | Kondo et al. |

* cited by examiner

*Primary Examiner* — Jung Kim
(74) *Attorney, Agent, or Firm* — Mandy Barsilai Fernandez; Frank D. Cimino (57) ABSTRACT

In described examples, an electronic circuit for determining a phase difference between a first clock signal and a second clock signal includes a timer circuit, circuitry for generating a selectively delayed transition of the second clock signal, and phase determination circuitry. The timer circuit produces an elapsed time between a transition of the first clock signal and the selectively delayed transition of the second clock signal. The circuitry for generating the selectively delayed transition of the second clock signal generates the selectively delayed transition in response to a random selection of a respective output from a plurality of second clock signal delay stages. The phase determination circuitry provides the phase difference in response to the elapsed time and the random selection of a respective output from a plurality of second clock signal delay stages.

15 Claims, 6 Drawing Sheets

TIME-TO-DIGITAL CONVERTER STOP TIME CONTROL

CROSS-REFERENCE TO RELATED APPLICATION(S)

This application is a continuation of U.S. patent application Ser. No. 17/515,598, filed Nov. 1, 2021 (issued U.S. Pat. No. 11,595,046), which is a continuation of U.S. patent application Ser. No. 17/087,978, filed on Nov. 3, 2020 (issued U.S. Pat. No. 11,196,426), which is a continuation of U.S. patent application Ser. No. 16/232,911, filed on Dec. 26, 2018 (issued U.S. Pat. No. 10,862,488), all of which are incorporated herein by reference in their entirety.

BACKGROUND

This application relates generally to electronic circuitry, and more particularly to a method and circuitry for determining the phase difference between a clock signal and a reference clock signal using a phase frequency detector (PFD).

PFDs are used to detect phase differences between signal inputs, and are used in a variety of applications, such as motor control, radar and telecommunication systems, servo mechanisms, and demodulators. PFDs are also used to support stable operation of phase locked loops (PLLs) in computer clock synchronization, demodulation, and frequency synthesis. Operation of PFDs in PLLs is used herein as an illustrative example.

When a first oscillator is disturbed by a second oscillator operating at a nearby frequency, and the coupling is strong enough and the frequencies near enough, the second oscillator can "capture" the first oscillator, causing the first oscillator to oscillate at an approximately identical frequency to the second oscillator. This is injection locking. Typically, in a PLL, the first oscillator is a reference clock, and the second oscillator is a feedback clock. The feedback clock is generated by using the reference clock to drive a variable oscillator (such as a digitally controlled oscillator, or DCO, or other voltage-controlled oscillator, or VCO) with the same frequency as the reference clock (or a rational multiple of the reference clock frequency), filtering the variable oscillator output, and matching the phase of the variable oscillator output to the phase of the reference clock. A PFD is used to perform the phase-matching. The output of the PFD, which preferably gives a digital time measurement of the phase difference between the reference clock and the feedback clock, is input into the variable oscillator to compensate for timing errors in the feedback clock signal to reduce, and preferably minimize, the phase difference.

Generally, a PFD injects a start signal, derived from an edge (transition) of the reference clock or the feedback clock, into a timer (a time-measuring circuit, such as a ring oscillator, which preferably gives a digital time measurement); and then injects a stop signal, derived from an edge of the feedback clock or the reference clock (respectively), into the timer. The time measured by the timer corresponds to the phase difference between the reference clock and the feedback clock. For example, if the start signal is derived from an edge of the reference clock, the stop signal is the next successive clock signal transition that follows and matches (rising edge stop for rising edge start, and falling edge stop for falling edge start) the reference clock transition that caused the start signal. The time between the start and stop signals is indicated by the number of whole periods of the timer through which the start signal propagates before the stop signal is received (determined using, for example, an integer counter), and the number of delay components through which the start signal propagates between the stop and start signals (which provides a fractional measurement that increases the phase delay measurement resolution of the PFD). The difference in timing between the start and stop signals, as received by the timer, indicates the phase difference between the clock signal and the reference clock signal.

SUMMARY

In described examples, an electronic circuit for determining a phase difference between a first clock signal and a second clock signal includes a timer circuit, circuitry for generating a selectively delayed transition of the second clock signal, and phase determination circuitry. The timer circuit produces an elapsed time between a transition of the first clock signal and the selectively delayed transition of the second clock signal. The circuitry for generating the selectively delayed transition of the second clock signal generates the selectively delayed transition in response to a random selection of a respective output from a plurality of second clock signal delay stages. The phase determination circuitry provides the phase difference in response to the elapsed time and the random selection of a respective output from a plurality of second clock signal delay stages.

DETAILED DESCRIPTION

Figure 1:
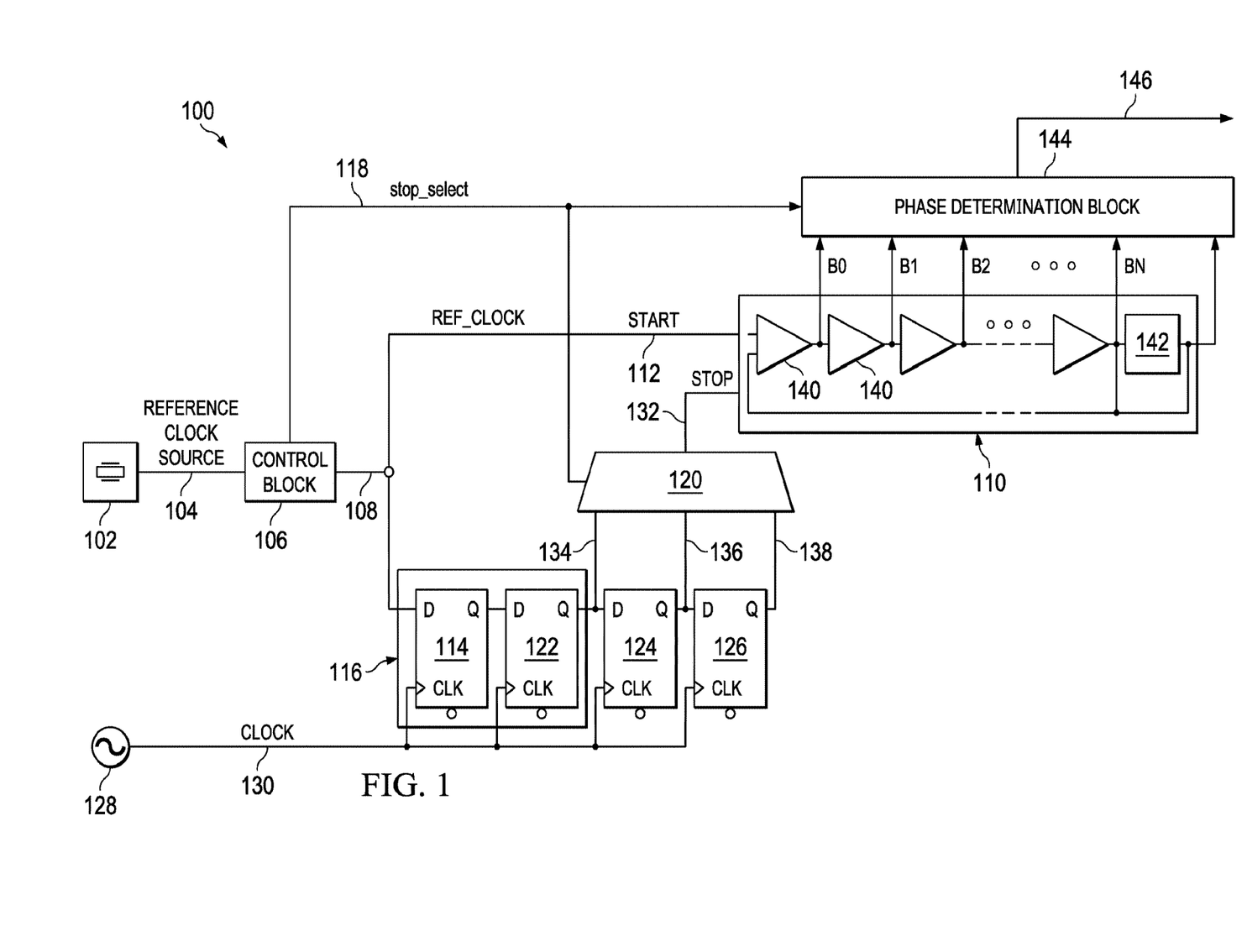
FIG. 1 shows an example of a block diagram of a phase frequency detector (PFD).

FIG. 1 shows an example of a block diagram of a phase frequency detector (PFD) 100. As shown in FIG. 1, a PFD 100 comprises a crystal oscillator 102 producing a reference clock source 104 signal (REFCLOCKSRC 104) with a frequency $N*F_{REF}$. The reference clock source 104 is connected to a control block 106 which divides down the reference clock source 104 (preferably, programmably) by a factor of N to produce a reference clock REF_CLOCK 108 with frequency $F_{REF}$. The control block 106 connects the REF_CLOCK 108 to a time-to-digital converter (TDC) 110 as a START input signal 112, and as a data input to a first synchronizing latch 114 in a synchronizing block 116. The control block 106 also produces a stop_select signal 118 (for example, using a pseudo-random binary sequence (PRBS) generator). The control block 106 connects the stop_select signal 118 to the control input of a multiplexer 120 to select the output of the multiplexer 120 from among multiple inputs (in the example shown in FIG. 1, three inputs). The first synchronizing latch 114 is connected to output the REF_CLOCK 108 to a data input of a second synchronizing latch 122 in the synchronizing block 116. The second synchronizing latch 122 is connected to output the REF_CLOCK 108 to a first delay latch 124, which is connected to provide the REF_CLOCK 108 to a second delay latch 126.

A variable oscillator 128, such as a DCO, produces a clock signal CLOCK 130 (for example, a PLL feedback clock). The variable oscillator 128 connects the CLOCK 130 to respective clock inputs of the first synchronizing latch 114, the second synchronizing latch 122, the first delay latch 124, and the second delay latch 126. Provision of the REF_CLOCK 108 by latches 114, 122, 124 to respective subsequent latches 122, 124, 126 is controlled by the CLOCK 130 (the clock input). Accordingly, the latches 114, 122, 124, 126 are clocked by the CLOCK 130. The second synchronizing latch 122 data output synch_out 134, the first delay latch 124 data output delay_1_out 136, and the second delay latch 126 data output delay_2_out 138 are connected to inputs of the multiplexer 120, to be selected in response to stop_select 118 to produce the multiplexer 120 output.

The multiplexer 120 output is connected to the TDC 110 as a STOP signal 132. Accordingly, for a number M−1 of delay latches synchronized by the CLOCK 130, with data inputs receiving the REF_CLOCK 108, and with outputs connected to the multiplexer 120, there are M possible STOP signals 132 (M signals corresponding to the REF PULSE 108 with different amounts of delay due to latches) for the multiplexer 120 to choose from using the stop_select signal 118. These possible STOP signals 132 correspond to the M−1 delay latch outputs 136, 138, plus the output 134 of the last synchronizing latch (in the example shown in FIG. 1, the second synchronizing latch 122).

The TDC 110 comprises a ring oscillator which includes multiple serially-connected buffers 140 (or other delay elements). Each buffer 140 preferably delays a signal by a known amount, and each buffer 140 preferably causes the same delay. The output of each but the last buffer 140 in the TDC 110 is connected to the input of a respective adjacent, subsequent buffer 140 in the TDC 110. The output of the last buffer 140 in the TDC 110 is connected to the input of the first buffer 140 in the TDC 110. The output of the first buffer 140 is numbered $B_0$, and outputs of subsequent buffers 140 are sequentially numbered $B_1, B_2, \ldots, B_n$, for a number n+1 total buffers 140 in the TDC 110. The output $B_n$ of the (n+1)th buffer 140 is connected to an input to a rollover counter 142. The control block 106 is connected to provide the stop_select signal 118 to a phase determination block 144. The TDC 110 outputs $B_0, B_1, B_2, \ldots, B_n$, and an output of the rollover counter 142, are also connected to the phase determination block 144. A phase determination block 144 output 146 is the output of the PFD 100.

The TDC 110 is a digital timer, used to determine the time between receipt by the TDC 110 of the START signal 112 and the STOP signal 132. The rollover counter 142 counts the number of cycles of the TDC 110 ring oscillator that elapse between the START signal 112 and the STOP signal 132. The time to complete one cycle of the TDC 110 ring oscillator is the sum of the delays caused by the buffers 140. The n+1 outputs of the buffers 140 indicate a fractional timing, that is, a fraction of a cycle of the TDC 110 that the START signal 112 has completed since the rollover counter 142 was last incremented.

The START signal 112 is a rising edge of the REF_CLOCK 108. The STOP signal 132 is the same rising edge of the REF_CLOCK 108, synchronized to a rising edge of the CLOCK 130 and delayed by a random number of CLOCK 130 cycles. Using the REF_CLOCK 108 as the START signal 112, and synchronizing the REF_CLOCK 108 to the CLOCK 130 to form the STOP signal 118, enables the TDC 110 to compare the timing of the REF_CLOCK 108 and the CLOCK 130 using two same-amplitude signals (so that the TDC 110 will react to the two signals the same way). Multiple synchronizing latches are preferably used so that the synchronization between the REF_CLOCK 108 and the CLOCK 130 can stabilize.

Randomly delaying (dithering the timing of) the STOP signal 118 randomizes the start-to-stop time outputted by the TDC 110. Because buffers 140 (delay elements) of the TDC 110 are subject to non-linear imperfections, they contribute noise to the timing result. Repeated output patterns (such as repeated identical outputs or a repeated identical series of outputs) by the TDC 110 can result in noise spurs in the PFD 100 output signal 146. Randomizing the time outputted by the TDC 110 whitens output noise (further described below with respect to FIG. 4), smoothing spurs.

The random number of CLOCK 130 cycles to delay the STOP signal 132 is selected using the randomly generated stop_select signal 118. For example, the stop_select signal 118 can have values of 0, 1, or 2, corresponding to synch_out 134 (stop_select=0), delay_1_out 136 (stop_select=1), and delay_2_out 138 (stop_select=2), respectively. Stop_select=0 selects a latch output corresponding to the REF_CLOCK 108 after it has propagated through two synchronizing latches 114, 122, resulting in a two CLOCK 130 cycle delay. Stop_select=1 selects a latch output corresponding to the REF_CLOCK 108 after it has propagated through two synchronizing latches 114, 122 and a delay latch 124, resulting in a three CLOCK 130 cycle delay. Stop_select=2 selects a latch output corresponding to the REF_CLOCK 108 after it has propagated through two synchronizing latches 114, 122 and two delay latches 124, 126, resulting in a four CLOCK 130 cycle delay. Different numbers of synchronizing latches and delay latches can be used to achieve different minimum and maximum amounts, respectively, of randomized delay.

The stop_select signal 118 indicates to the phase determination block 144 the number of CLOCK 130 cycles by which the STOP signal 132 was delayed. This enables the phase determination block 144 to subtract out the additional delay from the TDC 110 timing result. The difference between the TDC 110 timing result and the randomized delay selected by the stop_select signal 118 equals the time between a REF_CLOCK 108 rising edge (the START signal 112) and the next subsequent CLOCK 130 rising edge. This difference is the phase delay between the REF_CLOCK 108 and the CLOCK 130.

Once the REF_CLOCK 108 goes low (and assuming, for illustration, that a low signal corresponds to logical zero), the REF_CLOCK=0 value propagates through the latches 114, 122, 124, 126 prior to the REF_CLOCK 108 transitioning to a high (REF_CLOCK=1) value. This effectively resets any data stored in the latches 114, 122, 124, 126 to zero before the REF_CLOCK=1 value starts propagating through the latches 114, 122, 124, 126.

Figure 2:
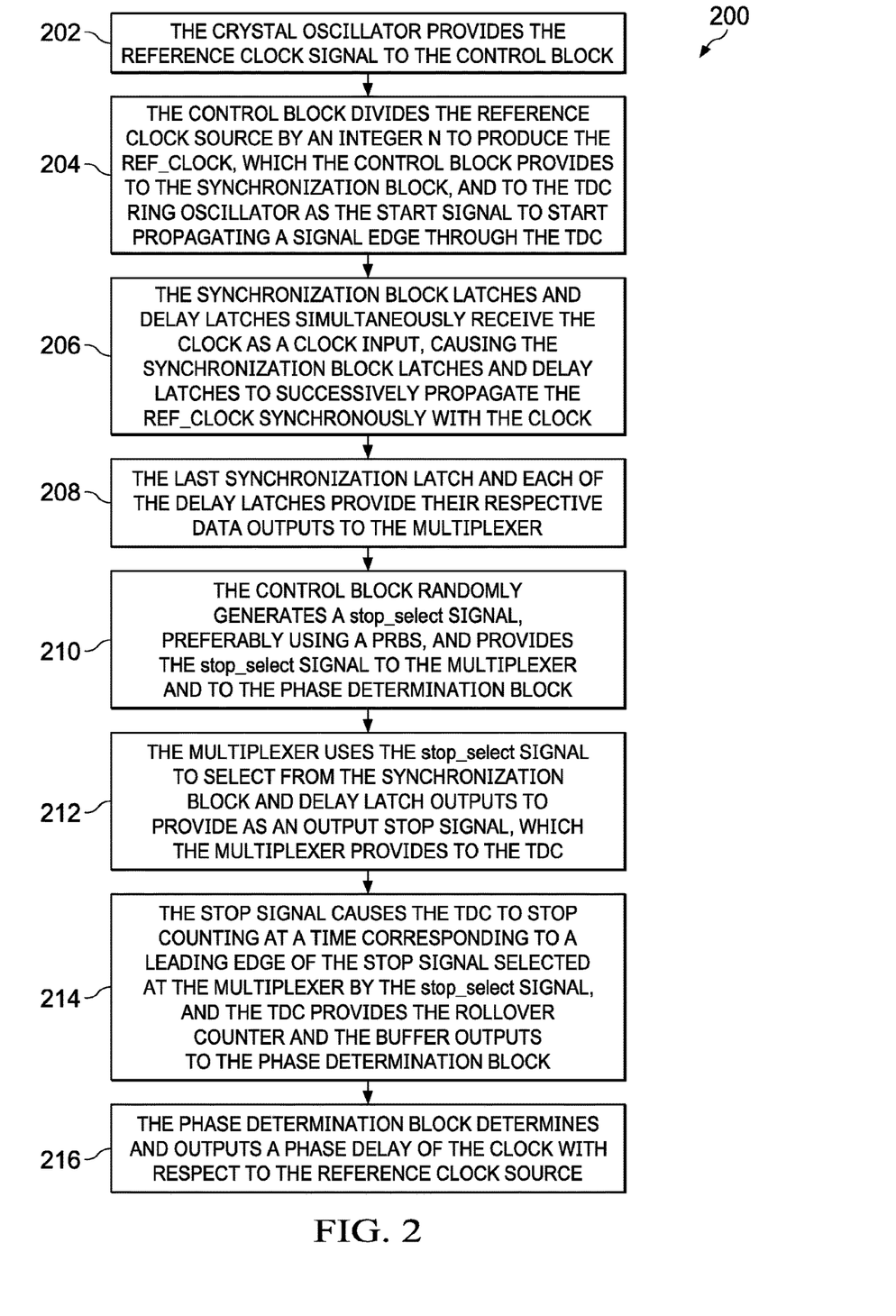
FIG. 2 shows an example process for determining the phase difference between the CLOCK and the reference clock source using the PFD of FIG. 1.
Figure 3:
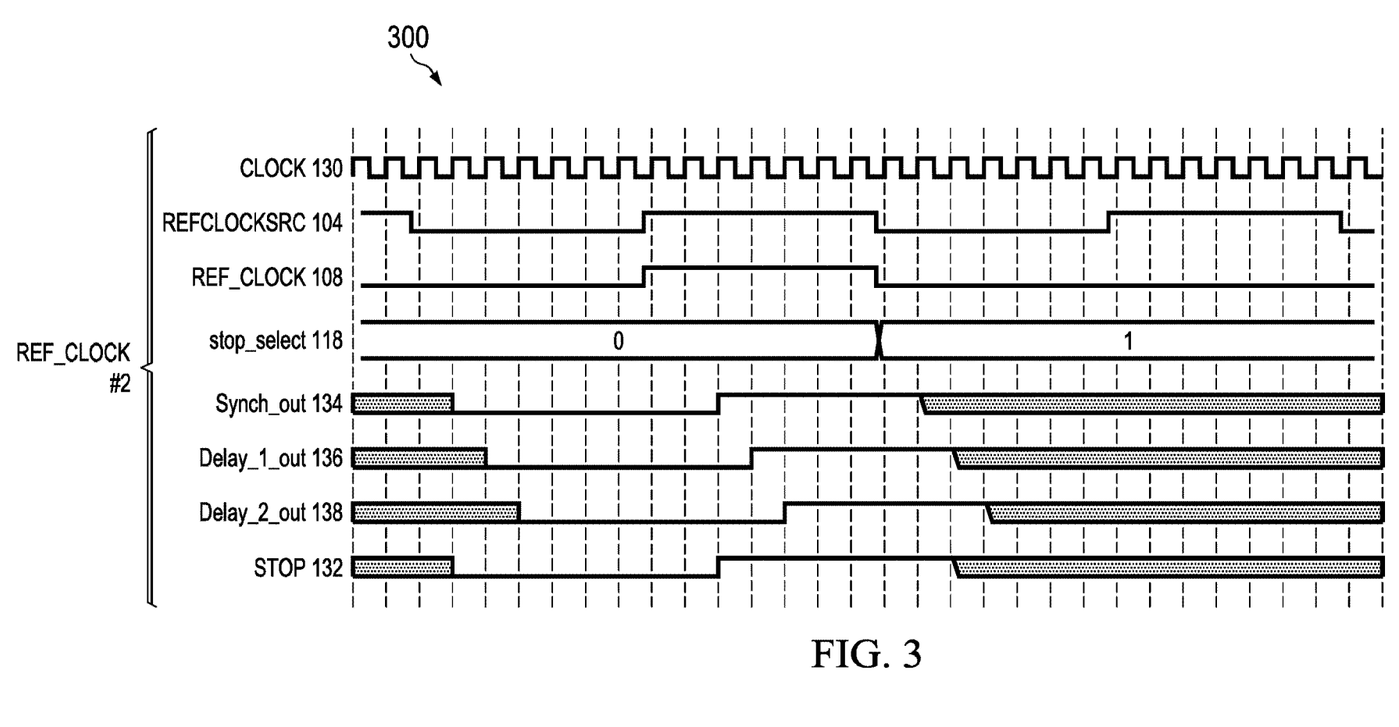
FIG. 3 shows an example timing diagram for the process of FIG. 2.

FIG. 2 shows an example process 200 for determining the phase difference between the CLOCK 130 and the REF_CLOCK 108 using the PFD 100 of FIG. 1. The PFD 100 compares the CLOCK 130 to the REF_CLOCK 108 to determine the phase difference between the CLOCK 130 and the REF_CLOCK 108. FIG. 3 shows an example timing diagram 300 for the process 200 of FIG. 2.

In step 202, the crystal oscillator 102 provides the reference clock source 104 to the control block 106. In step 204, the control block 106 optionally divides the reference clock source 104 by an integer N to produce the REF_CLOCK 108, and the control block 106 provides the REF_CLOCK 108 to the synchronization block 116, and to the TDC 110 as the START signal 112. As shown in FIG. 3, the CLOCK 130 is generally much higher frequency than the REF_CLOCK 108. (The CLOCK 130 will also generally be the same or higher frequency than the reference clock source 104 (REF-CLOCKSRC 104).) The START signal 112 causes the TDC 110 to start propagating a signal edge (with timing corresponding to a rising edge of the REF_CLOCK 108 and/or an arrival time of the REF_CLOCK 108 at the TDC 110) through the TDC 110 ring oscillator. In step 206, the synchronization block latches 114, 122 and delay latches 124, 126 simultaneously receive the CLOCK 130 as a clock input, causing the synchronization block latches 114, 122 and the delay latches 124, 126 to successively propagate the REF_CLOCK 108 synchronously with the CLOCK 130. The synchronization block 116 is used because the CLOCK 130 and the reference clock source 104 are asynchronous. Synchronizing the REF_CLOCK 108 to the CLOCK 130 enables use of a CLOCK-synchronized form of the REF_CLOCK 108 as a STOP signal 132, with a rising edge that has the same timing as a rising edge of the CLOCK 130.

In step 208, the last synchronization latch (in the example shown in FIG. 1, the second synchronization latch 122), and each of the delay latches 124, 126, provide their respective data outputs 134, 136, 138 to the multiplexer 120. In step 210, the control block 106 randomly generates a stop_select signal 118, preferably using a PRBS (pseudo-random binary sequence generator), and provides the stop_select signal 118 to the control input of the multiplexer 120 and to the phase determination block 144. (Randomization of the STOP signal 132 is discussed with respect to FIG. 4.) In step 212, the multiplexer 120 uses the stop_select signal 118 to select from the synchronization block 116 and delay latch 124, 126 outputs to provide as an output STOP signal 132, which the multiplexer 120 provides to the TDC 110.

In step 214, the STOP signal 132 causes the TDC 110 to stop counting at a time corresponding to a leading (as shown in FIG. 3, rising) edge of the STOP signal 132 selected at the multiplexer 120 by the stop_select signal 118, and the TDC 110 provides the rollover counter 142 and the buffer 140 outputs $B_0, B_1, B_2, \ldots, B_n$ to the phase determination block 144. These outputs indicate a digital delay amount, corresponding to the number of complete cycles of the TDC 110 through which the START signal 112 edge has propagated, plus additional delay (if any) corresponding to the buffer 136 output $B_0, B_1, B_2, \ldots, B_n$ which the START signal 112 edge has reached when the TDC 110 receives the STOP signal 132. In the example shown in FIG. 3, the stop_select signal 118 can have values of 0, 1, or 2, corresponding to selection as the STOP signal 132 of synch_out 134 (stop_select=0), delay_1_out 136 (stop_select=1), and delay_2_out 138 (stop_select=2), respectively. Accordingly, FIG. 3 shows the correspondence between the potential STOP signals 134, 136, 138, the stop_select signal 118, and the resulting STOP signal 132.

In step 216, the phase determination block 144 determines and outputs a phase delay of the CLOCK 130 with respect to the REF_CLOCK 108. The outputted phase delay corresponds to a delay indicated by the rollover counter 142 and the TDC 110 outputs $B_0, B_1, B_2, \ldots, B_n$, minus a delay corresponding to the (as shown, constant) number of synchronization latches and the (as shown, variable) number of delay latches through which the REF_CLOCK 108 propagated before being received by the TDC 110 as the STOP signal 132 (as indicated by the stop_select signal 118). The delay added by the latches 114, 122, 124, 126 is subtracted from the TDC 110 result to avoid adding the latch delay as noise in the phase delay measurement.

Figure 6:
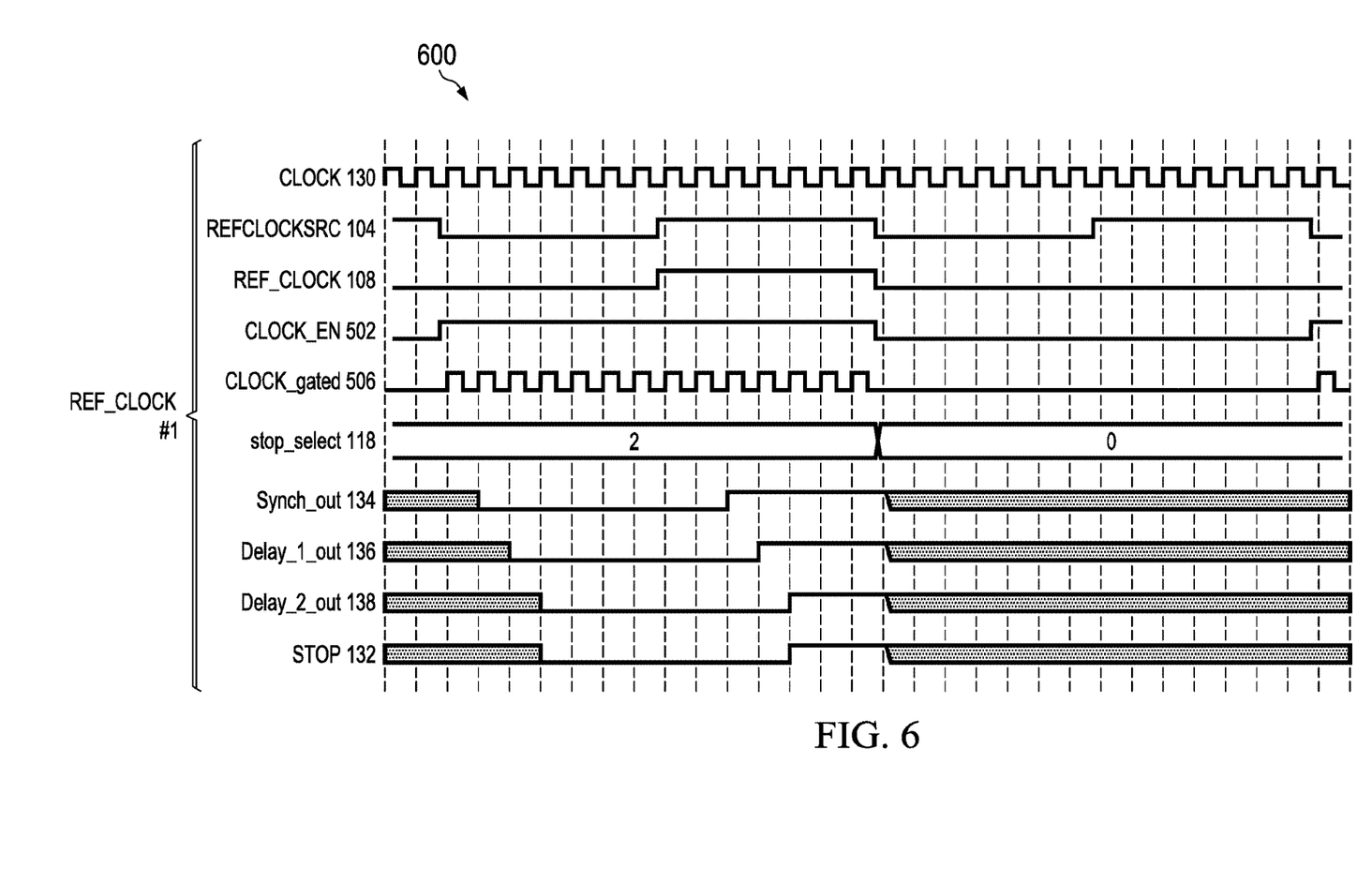
FIG. 6 shows an example of a timing diagram for the PFD of FIG. 5.

Individual latches propagate the REF_CLOCK 108 after each period of the CLOCK 130, because the latches are clocked using the CLOCK 130. Accordingly, the number of latches through which the REF_CLOCK 108 propagates before being received as the STOP signal 132 by the TDC 110 corresponds to an added number of periods of the CLOCK 130 as delay. For example, as shown in FIG. 3, if the STOP signal 132 corresponds to synch_out 134 (stop_select=0), then the STOP signal 132 will be delayed from the REF_CLOCK 108 by two CLOCK 130 cycles, corresponding to two latches (the two synchronizer latches 114, 122). Similarly, if the STOP signal 132 corresponds to delay_2_out 138 (stop_select=2), then the STOP signal 132 will be delayed from the REF_CLOCK 108 by four CLOCK 130 cycles, corresponding to four latches (the two synchronizer latches 114, 122 and the two delay latches 124, 126). In FIG. 6, stop_select=2, so the STOP signal 132 goes high when delay_2_out 138 goes high, four CLOCK 130 cycles after the REF_CLOCK 108 goes high.

The output 146 of the phase determination block 144 is the output of the PFD 100, and corresponds to the phase difference between the CLOCK 130 and the REF_CLOCK 108. In some embodiments, the TDC 110—and accordingly, the PFD 100—has a resolution measured in picoseconds.

Figure 4:
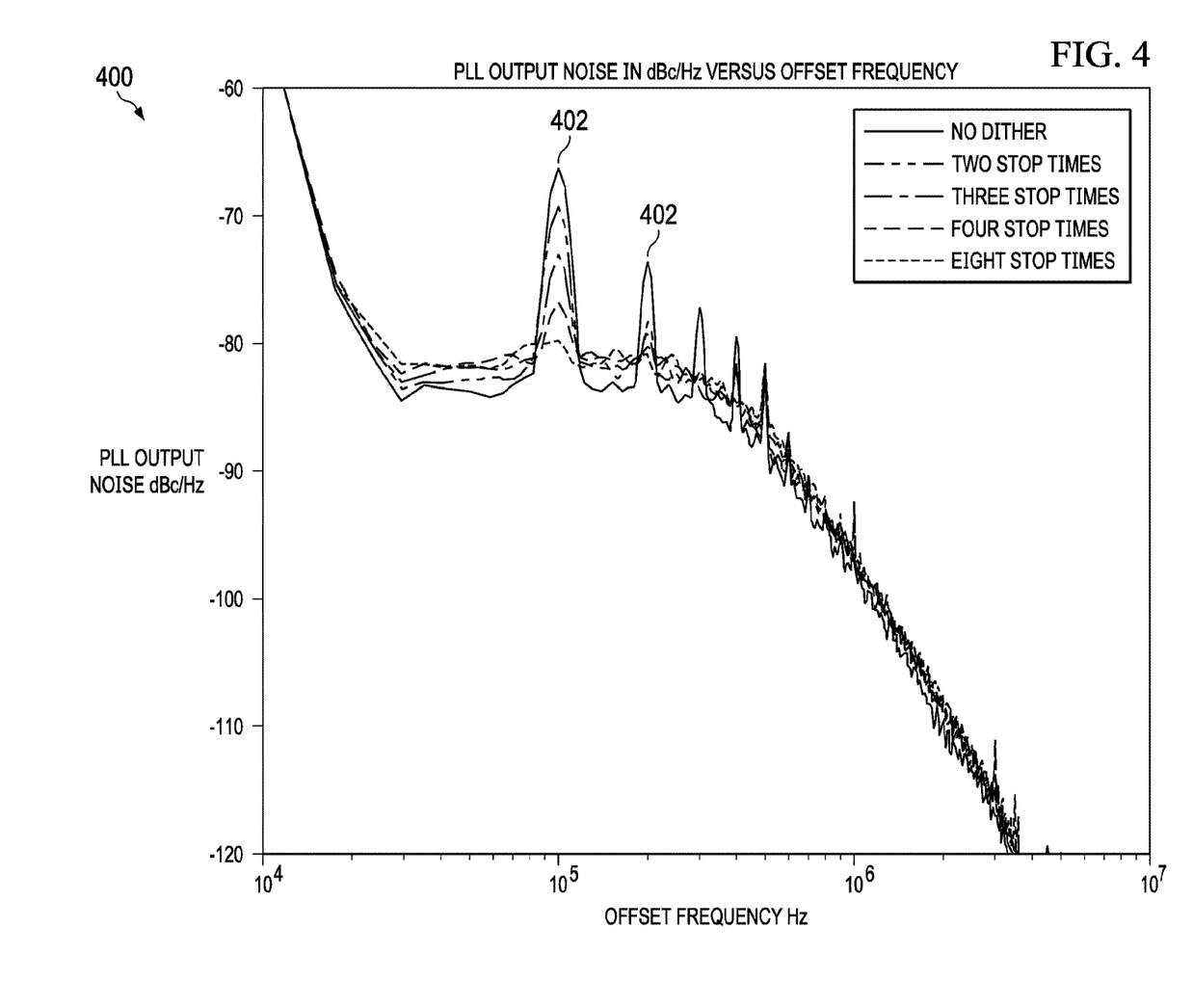
FIG. 4 shows an example plot of the phase noise of a phase locked loop (PLL) using the PFD of FIG. 1, relative to the carrier frequency of the PLL.

FIG. 4 shows an example plot 400 of the phase noise of a phase locked loop (PLL) using the PFD 100, relative to the carrier frequency of the PLL. In the examples of FIGS. 1 and 2, the CLOCK 130 is derived from the REF_CLOCK 108 (CLOCK 130 can be, for example, a PLL feedback clock), such that the frequency of the REF_CLOCK 108 $F_{REF}$ equals P/R multiplied by the frequency of the CLOCK 130 $F_{CLK}$, for integers P and R. Accordingly, $F_{CLK}$ is an integer or fractional channel of $F_{REF}$. As a result, in integer channels (P=1, so that $F_{CLK}=R*F_{REF}$), the CLOCK 130 will generally have minimal (or zero) phase delay with respect to the REF_CLOCK 108; and in fractional channels (P>1), phase delay results will repeat after a beat period of the CLOCK 130 and the REF_CLOCK 108 ($P*F_{CLK}=R*F_{REF}$; the beat frequency equals $F_{CLK} R/P*F_{CLK}$). Non-linearities in the TDC 110, and other noise sources, can be exacerbated by repeated identical results from the TDC 110. As shown in FIG. 4, this can result in spurs 402 (spikes in output noise) at the beat frequency of the CLOCK 130 and the REF_CLOCK 108, and at harmonics and sub-harmonics of the beat frequency of the CLOCK 130 and the REF_CLOCK 108. The plot 400 shows a large noise spur 402 approximately 100 kHz from the carrier frequency, plus multiple other noise spurs 402 at other offsets from the carrier frequency. As shown in FIG. 4, by using multiple, randomly selected STOP signals 132 with different stop times—by dithering the stop times—the energy in the output noise spurs 402 evident without dithering can be spread across the spectrum of the offset frequency, reducing the magnitude of the spurs 402. Accordingly, the noise introduced by the non-linearities in the TDC 110 is "whitened", randomizing the effects of the non-linearities on noise across the offset frequency spectrum, by the delay dithering process. Further, increasing the number of different, randomly selected stop times generally results in more smoothly spreading the noise energy across the spectrum.

Figure 5:
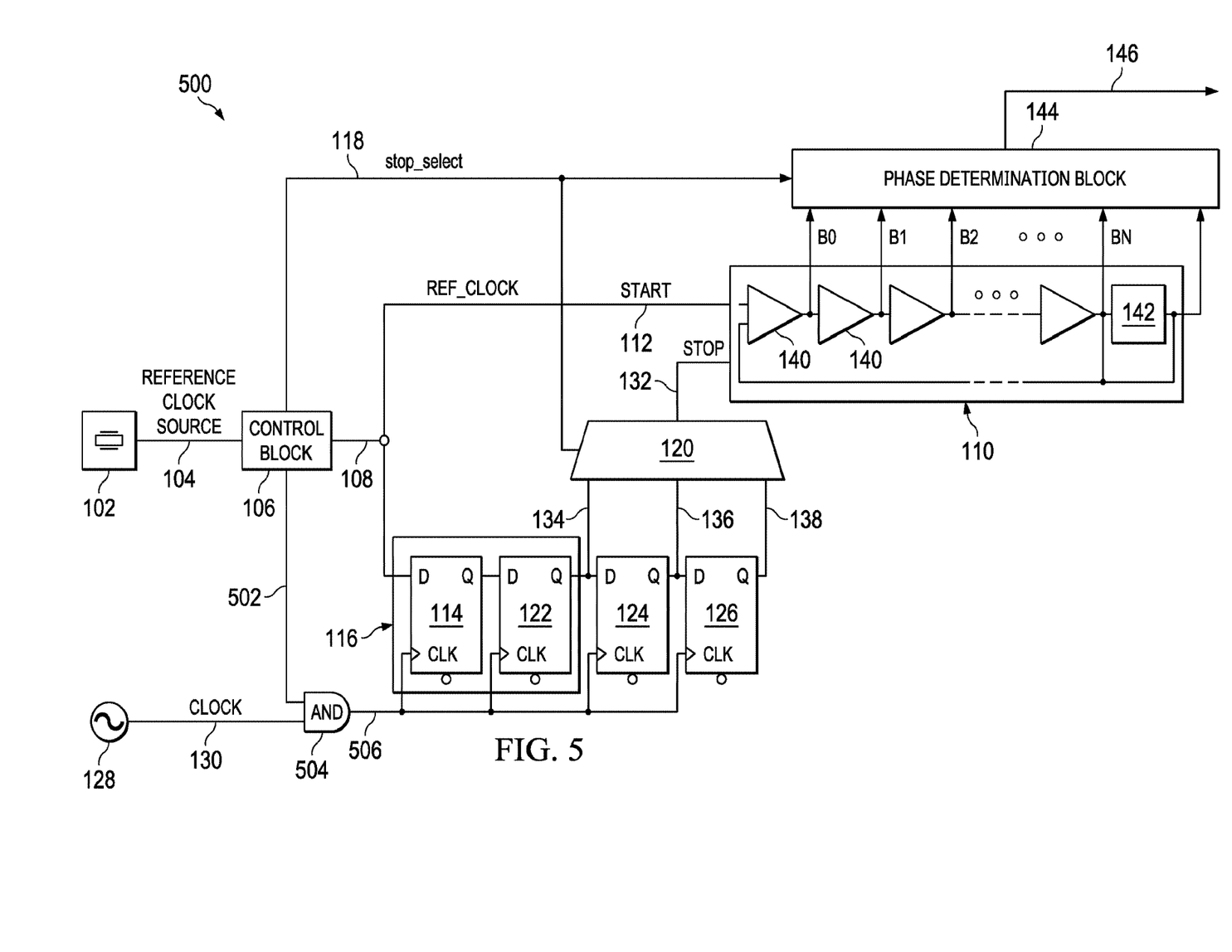
FIG. 5 shows an example of a block diagram of a PFD.

FIG. 5 shows an example of a block diagram of a PFD 500. FIG. 6 shows an example of a timing diagram 600 for the PFD 500 of FIG. 5. The latches 114, 122, 124, 126 consume power—in some embodiments, such as when the CLOCK 130 has a high frequency (for example, multiple GHz), a relatively large amount of power. This power consumption can be mitigated by limiting provision of the CLOCK 130 to the latches 114, 122, 124, 126 to times when the latches 114, 122, 124, 126 are to receive the CLOCK 130 for the PFD 500 to operate (accordingly, when the latches 114, 122, 124, 126 are to store and propagate the REF_CLOCK 108). Dynamic clock gating can be used to accomplish this, using the control block 106 to provide "early warning" of the edge of the REF_CLOCK 108 to be used to generate the STOP signal 132. For example, as shown in FIG. 6, if a rising edge of the REF_CLOCK 108 is used to generate the STOP signal 132, then an immediately preceding falling edge of the reference clock source 104 (or other preceding edge of the reference clock source 104 (REFCLOCKSRC 104)) can be used to trigger a CLOCK_EN signal 502 to go high. (As described above, the REF_CLOCK 108 is generated by dividing down the reference clock source 104.) Preferably, the CLOCK_EN signal 502 remains high long enough for the STOP signal 132 to trigger the TDC 110 to stop timing (the CLOCK_EN signal 502 can remain high for longer, generally incurring additional power cost). The CLOCK_EN signal 502 goes high before the REF_CLOCK 108 so that (assuming, for illustration, that a low signal corresponds to logical zero and a high signal corresponds to logical one) the REF_CLOCK=0 value can propagate through the latches 114, 122, 124, 126 prior to REF_CLOCK 108 transitioning to a high (REF_CLOCK=1) value. This effectively resets any data stored in the latches 114, 122, 124, 126 to zero before the REF_CLOCK=1 value starts propagating through the latches 114, 122, 124, 126. (High-value STOP signals 132 have no effect on the TDC 110 until the TDC 110 receives the START signal 112.)

As shown in FIGS. 5 and 6, an AND gate 504 can be used to limit the duration when the CLOCK 130 is provided to the latches 114, 122, 124, 126 to the period when the CLOCK_EN signal 502 is high. The output of the gating element 504 is a CLOCK gated 506 signal (a gated CLOCK 130). The latches 114, 122, 124, 126 are clocked by CLOCK gated 506, rather than by CLOCK 130. As a result, the duty cycle and power consumption of the latches 114, 122, 124, 126 can be significantly reduced. The power consumption reduction can correspond to, for example, latch_power_reduction[%]=$(1-F_{ref}/F_{referencesource})*100$ (where $F_{referencesource}$ is the frequency of the reference clock source 104). For example, if the REF_CLOCK 108 has a frequency ⅙ (16.67%) the frequency of the reference clock source 104, then the duty cycle of the latches 114, 122, 124, 126 can be reduced by duty cycle reduction[%]= $(1-⅙)*100=83\%$, with corresponding reduction in power consumption of the delay latches 124, 126.

Modifications are possible in the described embodiments, and other embodiments are possible, within the scope of the claims.

In some embodiments, a different number of synchronization latches is used.

In some embodiments, a different number of delay latches is used.

In some embodiments, different logic gates and/or signal waveforms other than those described herein are used.

In some embodiments, a reference clock other than a crystal oscillator is used.

In some embodiments, the clock signal is not derived from the reference clock signal.

In some embodiments, the reference clock source, REF_CLOCK, and CLOCK have different relative frequencies than those shown in the figures. In some embodiments, there are many periods of the CLOCK per period of the REF_CLOCK.

In some embodiments, a signal feature other than an edge is used to mark timing.

In some embodiments, falling edges or mixes of falling and rising edges can be used to mark timing.

In some embodiments, latches and/or clocked delay stages other than latches are used to selectively delay REF_CLOCK transitions (rising or falling edges).

In some embodiments, the ring oscillator uses delay components other than buffers.

In some embodiments, CLOCK_EN remains high until an edge of the reference clock signal subsequent to a falling edge of the REF_CLOCK.

In some embodiments, only the rollover counter is provided from the ring oscillator to the phase determination block, and/or the outputs of the delay elements of the TDC are not connected to the phase determination block.

In some embodiments, signals shown as high can instead be low, and vice versa. In some embodiments, signals used as logical ones can instead be logical zeroes, and vice versa.

In some embodiments, the AND gate of FIG. 5 can be a gate implementing a different logical operator.

What is claimed is:

1. An electronic circuit comprising:
   a first clock source terminal configured to receive a first clock signal;
   a second clock source terminal configured to receive a second clock signal;
   a set of latches having a first input and an output, wherein the first input of each latch is coupled to the first clock source terminal;
   a multiplexer having a plurality of inputs and an output, each input of the plurality of inputs of the multiplexer is coupled to the output of a respective latch of the set of latches;
   a time-to-digital converter having a first input, a second input, and a plurality of outputs, the first input coupled to the output of the multiplexer, and the second input coupled to the second clock source terminal; and
   a phase determination circuit having a plurality of inputs coupled to the plurality of outputs of the time-to-digital converter, and configured to provide a phase difference between the first clock signal and the second clock signal.

2. The electronic circuit of claim 1, wherein a first latch of the set of latches is coupled to the second clock source terminal.

3. The electronic circuit of claim 2, wherein the output of the first latch is coupled to the second input of a second latch of the set of latches.

4. The electronic circuit of claim 1, wherein the multiplexer comprises a selector input configured to receive a selector signal, and wherein the phase determination circuit comprises a first input configured to receive the selector signal.

5. The electronic circuit of claim 1, wherein the time-to-digital converter comprises:
   a plurality of buffers, wherein an output of each buffer is coupled to one of the plurality of outputs of the time-to-digital converter; and
   a counter coupled to the output of a buffer of the plurality of buffers, and having an output coupled to the phase determination circuit.

6. The electronic circuit of claim 5, wherein the plurality of buffers are serially connected, and the output of each buffer is coupled to an input of another buffer of the plurality of buffers.

7. The electronic circuit of claim 1, further comprising an AND gate having an output coupled to the first clock source terminal, and a first input coupled to an oscillator.

8. The electronic circuit of claim 7, further comprising a control block configured to provide an enable signal to a second input of the AND gate.

9. The electronic circuit of claim 1, further comprising a control circuit comprising a second clock source having an output coupled to the second clock source terminal, the control circuit configured to provide a selector signal to the phase determination circuit and to the multiplexer.

10. The electronic circuit of claim 1, wherein the first clock signal has a first frequency, and the second clock signal has a second frequency, wherein the first frequency is greater than the second frequency.

11. The electronic circuit of claim 1, further comprising a first clock source having an output coupled to the first clock source terminal, and a second clock source having an output coupled to the second clock source terminal.

12. The electronic circuit of claim 4, further comprising a control circuit configured to generate the selector signal in a pseudo-random manner.

13. The electronic circuit of claim 12, wherein the control circuit comprises a pseudo-random binary sequence (PRBS) generator configured to generate the selector signal.

14. The electronic circuit of claim 5, wherein the plurality of buffers are arranged as a ring oscillator.

15. The electronic circuit of claim 4, wherein the time-to-digital converter is configured to generate an elapsed time between an edge of the first clock signal and an edge of the second clock signal, and wherein the phase determination circuit is configured to subtract a delay time based on the selector signal from the elapsed time to produce the phase difference.

* * * * *